(12) United States Patent
Yamazaki et al.

(10) Patent No.: US 9,437,758 B2
(45) Date of Patent: Sep. 6, 2016

(54) PHOTOELECTRIC CONVERSION DEVICE

(75) Inventors: Shunpei Yamazaki, Tokyo (JP); Fumito Isaka, Kanagawa (JP); Jiro Nishida, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 687 days.

(21) Appl. No.: 13/398,872

(22) Filed: Feb. 17, 2012

(65) Prior Publication Data
US 2012/0211066 A1 Aug. 23, 2012

(30) Foreign Application Priority Data

Feb. 21, 2011 (JP) ................................. 2011-034575

(51) Int. Cl.
| | | |
|---|---|---|
| *H01L 31/00* | (2006.01) | |
| *H01L 31/0236* | (2006.01) | |
| *H01L 31/028* | (2006.01) | |
| *H01L 31/068* | (2012.01) | |
| *H01L 31/056* | (2014.01) | |

(52) U.S. Cl.
CPC ....... *H01L 31/02363* (2013.01); *H01L 31/028* (2013.01); *H01L 31/056* (2014.12); *H01L 31/068* (2013.01); *Y02E 10/52* (2013.01); *Y02E 10/547* (2013.01)

(58) Field of Classification Search
USPC ......................................... 136/255, 256, 258
See application file for complete search history.

(56) References Cited

U.S. PATENT DOCUMENTS

| | | |
|---|---|---|
| 4,385,199 A | 5/1983 | Hamakawa et al. |
| 4,385,200 A | 5/1983 | Hamakawa et al. |
| 4,388,482 A | 6/1983 | Hamakawa et al. |
| 4,496,788 A | 1/1985 | Hamakawa et al. |
| 4,633,034 A | 12/1986 | Nath et al. |
| 5,213,628 A | 5/1993 | Noguchi et al. |
| 5,371,037 A | 12/1994 | Yonehara |
| 5,665,607 A | 9/1997 | Kawama et al. |
| 5,750,000 A | 5/1998 | Yonehara et al. |

(Continued)

FOREIGN PATENT DOCUMENTS

| | | |
|---|---|---|
| EP | 1643564 A | 4/2006 |
| EP | 2190027 A | 5/2010 |

(Continued)

OTHER PUBLICATIONS

Nomura et al., "Thin-Film Transistor Fabricated in Single-Crystalline Transparent Oxide Semiconductor", Science, vol. 300, No. 5623, 2003, pp. 1269-1272.

*Primary Examiner* — Eli Mekhlin
(74) *Attorney, Agent, or Firm* — Nixon Peabody LLP; Jeffrey L. Costellia

(57) ABSTRACT

A photoelectric conversion device in photoelectric conversion in a light-absorption region in a crystalline silicon substrate is efficiently performed is provided. In the photoelectric conversion device, a light-transmitting conductive film which has a high effect of passivation of defects on a silicon surface and improves the reflectance on a back electrode side is provided between the back electrode and the crystalline silicon substrate, The light-transmitting conductive film includes an organic compound and an inorganic compound. The organic compound includes 4-phenyl-4'-(9-phenylfluoren-9-yl)triphenylamine. The inorganic compound includes an oxide of a metal belonging to any of Groups 4 to 8 of the periodic table.

12 Claims, 11 Drawing Sheets

(56) References Cited

U.S. PATENT DOCUMENTS

| | | |
|---|---|---|
| 5,840,616 A | 11/1998 | Sakaguchi et al. |
| 6,091,019 A * | 7/2000 | Sakata et al. .................. 136/256 |
| 6,310,282 B1 | 10/2001 | Sakurai et al. |
| 6,692,981 B2 | 2/2004 | Takato et al. |
| 7,052,998 B2 | 5/2006 | Shinohara |
| 7,375,378 B2 * | 5/2008 | Manivannan et al. .......... 257/79 |
| 7,517,470 B2 | 4/2009 | Seo et al. |
| 7,736,933 B2 | 6/2010 | Arai et al. |
| 7,858,431 B2 | 12/2010 | Isaka et al. |
| 7,871,849 B2 | 1/2011 | Arai |
| 7,888,167 B2 * | 2/2011 | Yamazaki et al. .............. 438/96 |
| 8,049,101 B2 | 11/2011 | Terakawa |
| 8,075,792 B1 * | 12/2011 | Branz et al. ..................... 216/89 |
| 8,921,688 B2 | 12/2014 | Yamasaki et al. |
| 2005/0070107 A1 | 3/2005 | Shinohara |
| 2006/0255340 A1 * | 11/2006 | Manivannan et al. .......... 257/79 |
| 2007/0221269 A1 | 9/2007 | Sakai et al. |
| 2009/0223561 A1 * | 9/2009 | Kim et al. .................. 136/256 |
| 2010/0006147 A1 * | 1/2010 | Nakashima et al. .......... 136/256 |
| 2010/0024871 A1 * | 2/2010 | Oh .................... H01L 31/02363 136/255 |
| 2010/0035022 A1 * | 2/2010 | Yeh .............................. 428/141 |
| 2010/0037946 A1 * | 2/2010 | Yatabe et al. ................. 136/256 |
| 2010/0207518 A1 | 8/2010 | Ikeda et al. |
| 2010/0229935 A1 | 9/2010 | Sakai et al. |
| 2010/0243058 A1 | 9/2010 | Meguro et al. |
| 2010/0301744 A1 | 12/2010 | Osaka et al. |
| 2010/0313952 A1 * | 12/2010 | Coakley et al. .............. 136/258 |
| 2011/0088763 A1 | 4/2011 | Le et al. |
| 2011/0210316 A1 * | 9/2011 | Kadoma ............... C07D 403/10 257/40 |
| 2012/0211065 A1 | 8/2012 | Yamazaki et al. |
| 2012/0211067 A1 | 8/2012 | Yamazaki et al. |
| 2012/0211081 A1 | 8/2012 | Yamazaki et al. |

FOREIGN PATENT DOCUMENTS

| | | |
|---|---|---|
| EP | 2190028 A | 5/2010 |
| JP | 55-120181 | 9/1980 |
| JP | 57-181176 | 11/1982 |
| JP | 59-124772 | 7/1984 |
| JP | 04-130671 A | 5/1992 |
| JP | 07-130661 | 5/1995 |
| JP | 07-263731 | 10/1995 |
| JP | 08-127860 A | 5/1996 |
| JP | 10-135497 A | 5/1998 |
| JP | 10-335683 | 12/1998 |
| JP | 2001-308354 | 11/2001 |
| JP | 2003-197943 A | 7/2003 |
| JP | 2003-298088 A | 10/2003 |
| JP | 2004-079934 | 3/2004 |
| JP | 2005-101384 | 4/2005 |
| JP | 2007-266095 A | 10/2007 |
| JP | 2008-034543 A | 2/2008 |
| JP | 2009-044184 | 2/2009 |
| JP | 2009-054997 A | 3/2009 |
| JP | 2009-088489 A | 4/2009 |
| JP | 2009-231781 | 10/2009 |
| JP | 2009-246031 A | 10/2009 |
| JP | 2010-239139 A | 10/2010 |

* cited by examiner

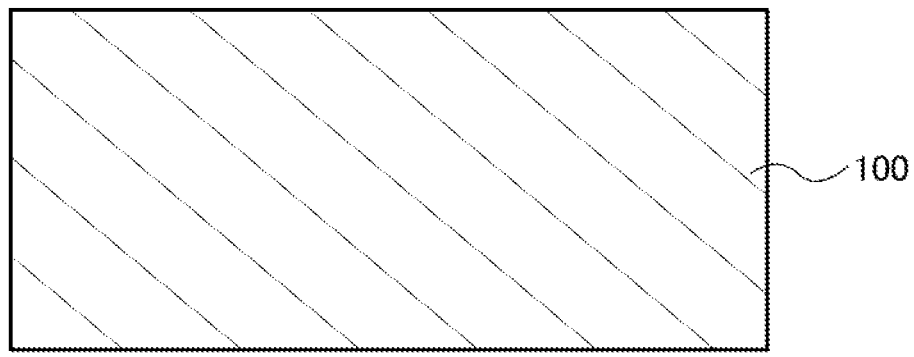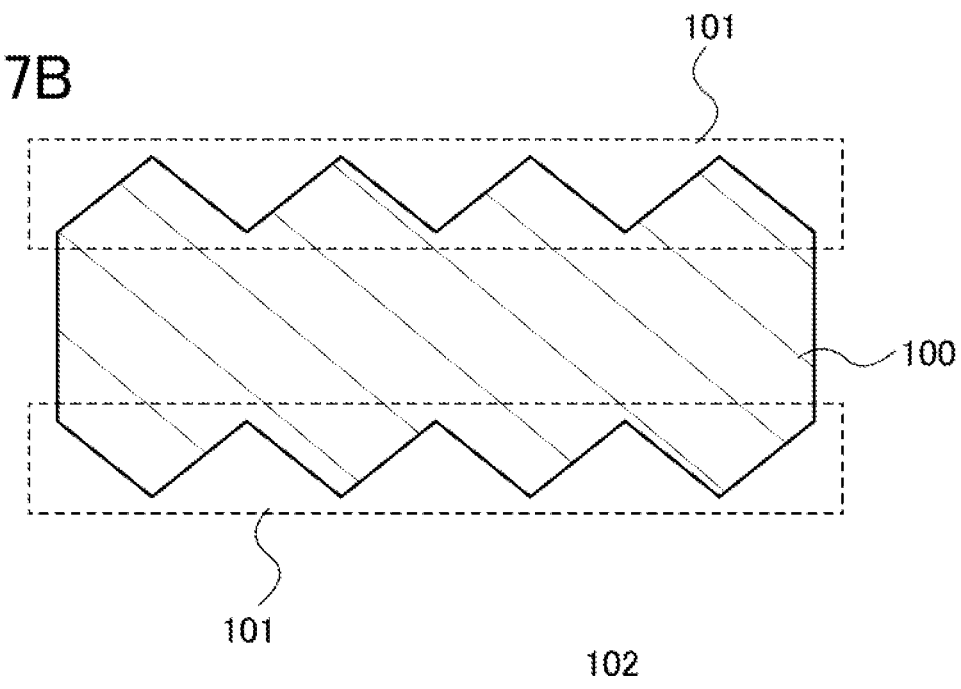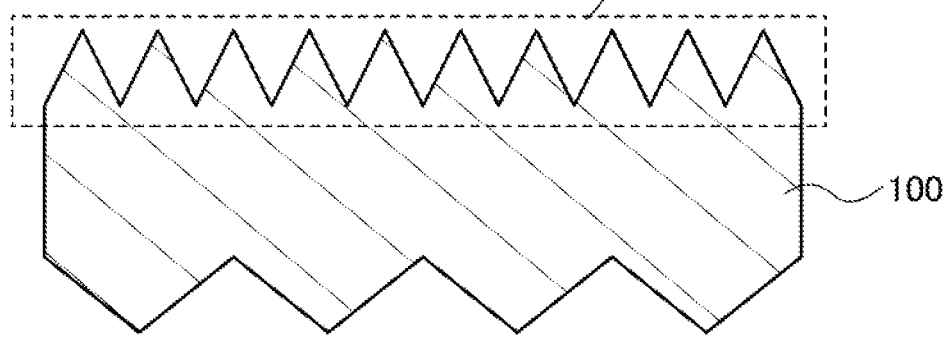

PHOTOELECTRIC CONVERSION DEVICE

BACKGROUND OF THE INVENTION

1. Field of the Invention

The present invention relates to a photoelectric conversion device including a light-transmitting conductive film with which the reflectance oh a back electrode side is improved.

2. Description of the Related Art

In recent years, a photoelectric conversion device that generates power without carbon dioxide emissions has attracted attention as a countermeasure against global warming. As a typical example thereof, a solar cell which uses a crystalline silicon substrate of single crystal silicon or polycrystalline silicon has been known.

In solar cells using a crystalline silicon substrate, a structure having so-called homo junction is widely used. In such a structure, a layer having the conductivity type opposite to that of the crystalline silicon substrate is formed on one surface side of the crystalline silicon substrate by diffusion of impurities.

Alternatively, a structure with hetero junction in which amorphous silicon having different optical band gap and conductivity type from those of a crystalline silicon substrate is formed on one surface side of the crystalline silicon substrate is known (see Patent Documents 1 and 2).

REFERENCE

Patent Documents

[Patent Document 1] Japanese Published Patent Application No. H04-130671
[Patent Document 2] Japanese Published Patent Application No. H10-135497

SUMMARY OF THE INVENTION

An improvement in light-absorption characteristics of a photoelectric conversion region is effective in improving electric characteristics of a photoelectric conversion device. For example, the following method can be given: a surface (front surface) and/or a back surface (rear surface) of a substrate are/is provided with unevenness, whereby multiple reflection from the surface of the substrate, an increase in optical path length in a photoelectric conversion region, and a total reflection effect (light-trapping effect) in which light reflected by the back surface is reflected by the surface are utilized.

However, a function effect of the unevenness is not sufficiently obtained in some cases, and another method for improving the light-absorption characteristics in the photoelectric conversion region is necessary to further improve the electric characteristics of the photoelectric conversion device. For example, in the case where a crystalline silicon substrate is formed thin, the optical path length in the photoelectric conversion region becomes short; thus, an effect of an increase in optical path length due to formation of the unevenness cannot be obtained, so that photoelectric conversion is hot efficiently performed.

Therefore, an object of one embodiment of the present invention is to provide a photoelectric conversion device in which photoelectric conversion can be efficiently performed in a light-absorption region.

One embodiment of the present invention disclosed in this specification relates to a photoelectric conversion device including a light-transmitting conductive film which includes an organic compound and an inorganic compound and with which the reflectance on a back electrode side is improved.

One embodiment of the present invention disclosed in this specification is a photoelectric conversion device including a crystalline silicon substrate having one conductivity type and including an impurity region having a conductivity type opposite to the one conductivity type, the impurity region being formed in a surface layer on one of surfaces of the crystalline silicon substrate; a first electrode formed on the impurity region; a light-transmitting conductive film formed on the other surface of the crystalline silicon substrate; and a second electrode formed on the light-transmitting conductive film. The light-transmitting conductive film includes an organic compound and an inorganic compound.

Note that in this specification and the like, ordinal numbers such as "first" and "second" are used in order to avoid confusion among components, and do not limit the order or number of the components.

An impurity region having the same conductivity type as the crystalline silicon substrate and having higher carrier density than the crystalline silicon substrate may be formed in a surface layer oh the other surface of the crystalline silicon substrate.

Another embodiment of the present invention disclosed in this specification is a photoelectric conversion device including a crystalline silicon substrate; a first semiconductor layer formed on one of surfaces of the crystalline silicon substrate; a second semiconductor layer formed on the first semiconductor layer; a first light-transmitting conductive film formed on the second semiconductor layer; a first electrode formed on the first light-transmitting conductive film; a third semiconductor layer formed on the other surface of the crystalline silicon substrate; a fourth semiconductor layer formed on the third semiconductor layer; a second light-transmitting conductive film formed on the fourth semiconductor layer; and a second electrode formed on the second light-transmitting conductive film. The second light-transmitting conductive film includes an organic compound and an inorganic compound.

For the first semiconductor layer and the third semiconductor layer, i-type amorphous silicon with few defects can be used.

The second semiconductor layer is a silicon semiconductor layer having a conductivity type opposite to a conductivity type of the crystalline silicon substrate, and the fourth semiconductor layer is a silicon semiconductor layer having the same conductivity as the crystalline silicon substrate. Note that the fourth semiconductor layer is a silicon semiconductor layer having higher carrier density than the crystalline silicon substrate.

For the inorganic compound, an oxide of a metal belonging to any of Groups 4 to 8 of the periodic table can be used. Specifically, vanadium oxide, niobium oxide, tantalum oxide, chromium oxide, molybdenum oxide, tungsten oxide, manganese oxide, and rhenium oxide are given.

The organic compound can be selected from an aromatic amine compound, a carbazole derivative, an aromatic hydrocarbon, a high molecular compound, or a heterocyclic compound having a dibenzofuran skeleton or a dibenzothiophene skeleton.

The light-transmitting conductive film has a thickness greater than 0 nm and the upper limit of the thickness is 140 nm; the thickness is preferably greater than or equal to 20 nm and less than or equal to 80 nm, more preferably greater than or equal to 30 nm and less than or equal to 60 nm.

According to one embodiment of the present invention, a photoelectric conversion device in which a substantial optical path length in a crystalline silicon substrate can be lengthened and which has high conversion efficiency can be provided.

BRIEF DESCRIPTION OF THE DRAWINGS

FIGS. 7A to 7C are cross-sectional views illustrating a process of a manufacturing method of a photoelectric; conversion device according to one embodiment of the present invention.

DETAILED DESCRIPTION OF THE INVENTION

Figure 1A:
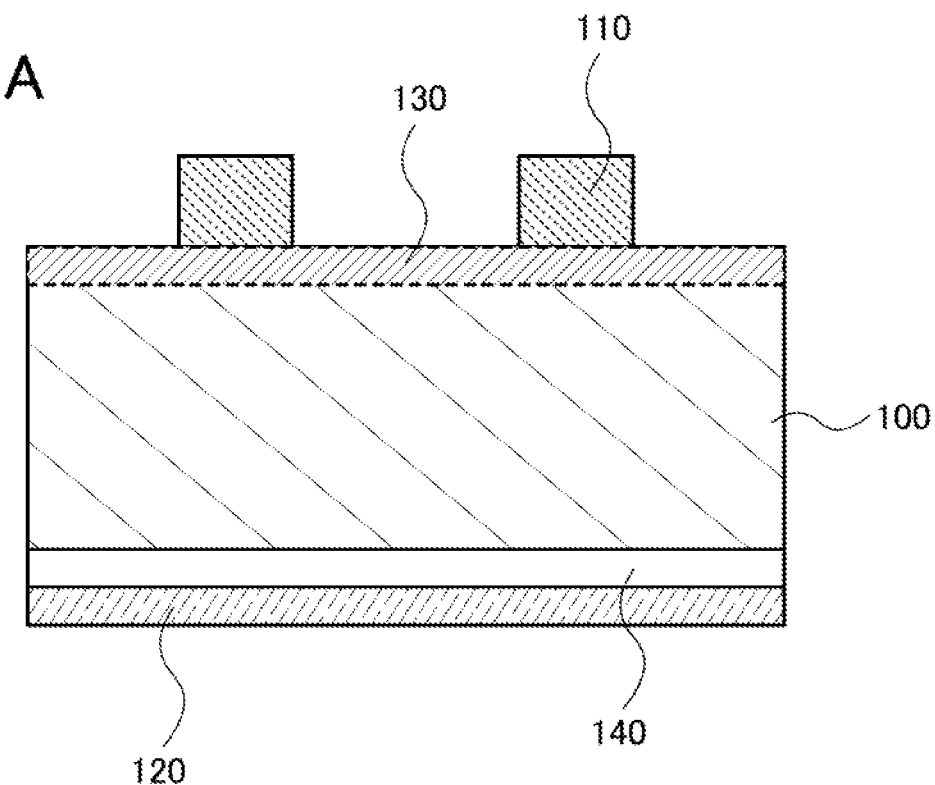
FIGS. 1A and 1B are cross-sectional views each illustrating a photoelectric conversion device according to one embodiment of the present invention.

Hereinafter, embodiments of the present invention will be described in detail with reference to the accompanying drawings. Note that the present invention is not limited to the description below, and it is easily understood by those skilled in the art that modes and details disclosed herein can be modified in various ways. Therefore, the present invention is not construed as being limited to description of the embodiments below. Note that in all drawings used to illustrate the embodiments, portions that are identical or portions having similar functions are denoted by the same reference numerals, and their repetitive description may be omitted.

[Embodiment 1]

In this embodiment, a photoelectric conversion device according to one embodiment of the present invention, and a manufacturing method thereof will be described.

In recent years, a photoelectric conversion device including a thin crystalline silicon substrate has been desired in view of resource saving and cost reduction. In a photoelectric conversion device, a surface (front surface) and/or a back surface (rear surface) serving as a light-receiving surface are/is provided with unevenness, whereby the electric characteristics can be improved. However, when a crystalline silicon substrate is made thin, the optical path length in the substrate is shortened; thus, among advantageous effects derived from the unevenness provided for the surface of the substrate, an effect of an increase in optical path length is reduced. In order to compensate for this phenomenon, the reflectance of a back electrode is preferably improved.

In the case where the crystalline silicon substrate is made thin, the absolute amount of light arriving at: the back electrode is increased; thus, the absolute amount of light loss is large when the reflectance of the back electrode is low, so that photoelectric conversion is not efficiently performed. Therefore, also in view of this, the reflectance of the back electrode is preferably improved.

In a photoelectric conversion device according to one embodiment of the present invention, a light-transmitting conductive film including a composite material of an inorganic compound and an organic compound each having an excellent light-transmitting property is provided between a crystalline silicon substrate and a back electrode. By providing the light-transmitting conductive film, an interface having high birefringence is generated between the light-transmitting conductive film and the back electrode; thus, the reflectance can be improved. Therefore, a substantial optical path length in the crystalline silicon substrate can be lengthened.

Since the light-transmitting conductive film has a high passivation effect, a defect is less likely to be generated at the interface with the crystalline silicon substrate and recombination of photo-induced carriers can be prevented. By such effects, a photoelectric conversion device with high conversion efficiency can be manufactured. In particular, advantageous effects obtained in the case where the crystalline silicon substrate is made thin are remarkable.

FIG. 1A is a cross-sectional view of a photoelectric conversion device according to one embodiment of the present invention. The photoelectric conversion device includes a crystalline silicon substrate 100, an impurity region 130 formed in a surface layer on one surface of the crystalline silicon substrate, a first electrode 110 formed on the impurity region, a light-transmitting conductive film 140 formed on the other surface of the crystalline silicon substrate 100, and a second electrode 120 formed on the light-transmitting conductive film. Note that the first electrode 110 is a grid electrode; arid the surface on the first electrode 110 side serves as a light-receiving surface. The second electrode 120 serves as a back electrode.

Figure 1B:
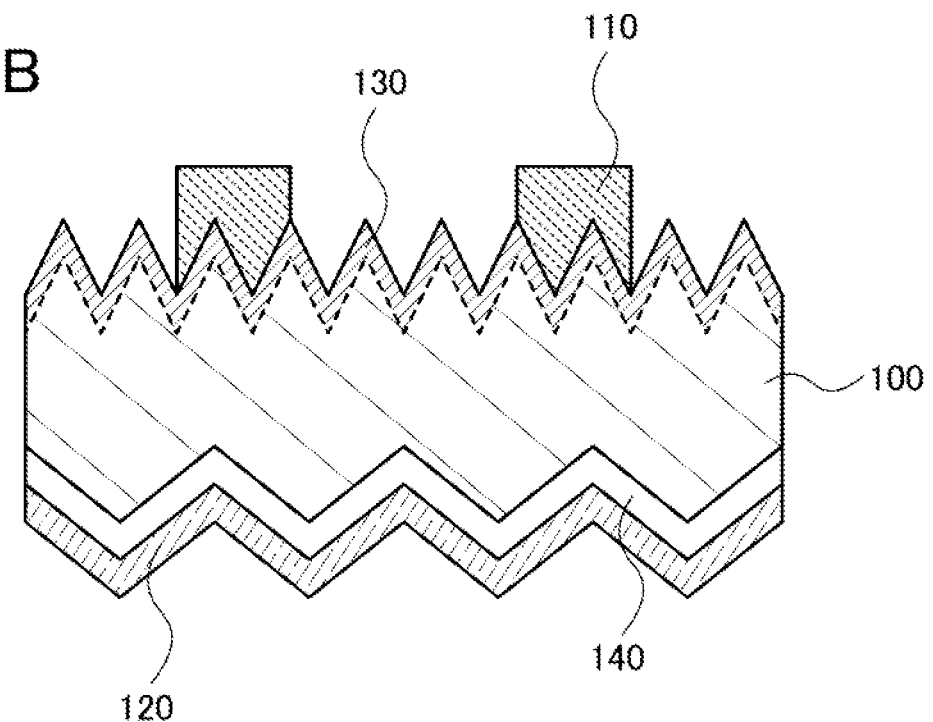

FIG. 1B illustrates an example in which a surface (front surface) and a back surface (rear surface) of the, crystalline silicon substrate 100 are processed to have unevenness in a stacked structure similar to that of FIG. 1A. Incident light is reflected in a multiple manner from the surface provided with unevenness, and travels obliquely in a photoelectric conversion region; thus, the optical path length is increased. In addition, a so-called light trapping effect in which tight reflected by the back surface is totally reflected by the surface can occur. Accordingly, the photoelectric conversion efficiency of the photoelectric conversion device can be improved.

Further, when the surface serving as a light-receiving surface is processed to have unevenness such that the distance between projecting portions or depressed portions is several tens of nanometers to several hundreds of nanometers, the reflectance of light with a wavelength in the range of 300 nm to 1200 nm can be as low as 5% or lower; thus, a high anti-reflection effect can be obtained. Note that the structure is not limited to that illustrated in FIG. 1B. A structure in which one of surfaces (the front surface and the back surface) is processed to have unevenness may be employed. Alternatively, a structure in which the surface and the back surface are processed to have the same unevenness shape may be employed.

The crystalline silicon substrate 100 has one conductivity type, and the impurity region 130 is a region having the opposite conductivity type to that of the crystalline silicon substrate 100. Thus, a p-n junction is formed at the interface between the crystalline silicon substrate 100 and the impurity region 130. Here, in one embodiment of the present invention, the impurity region 130 has n-type conductivity because the crystalline silicon substrate 100 having p-type conductivity is used.

Figure 2:
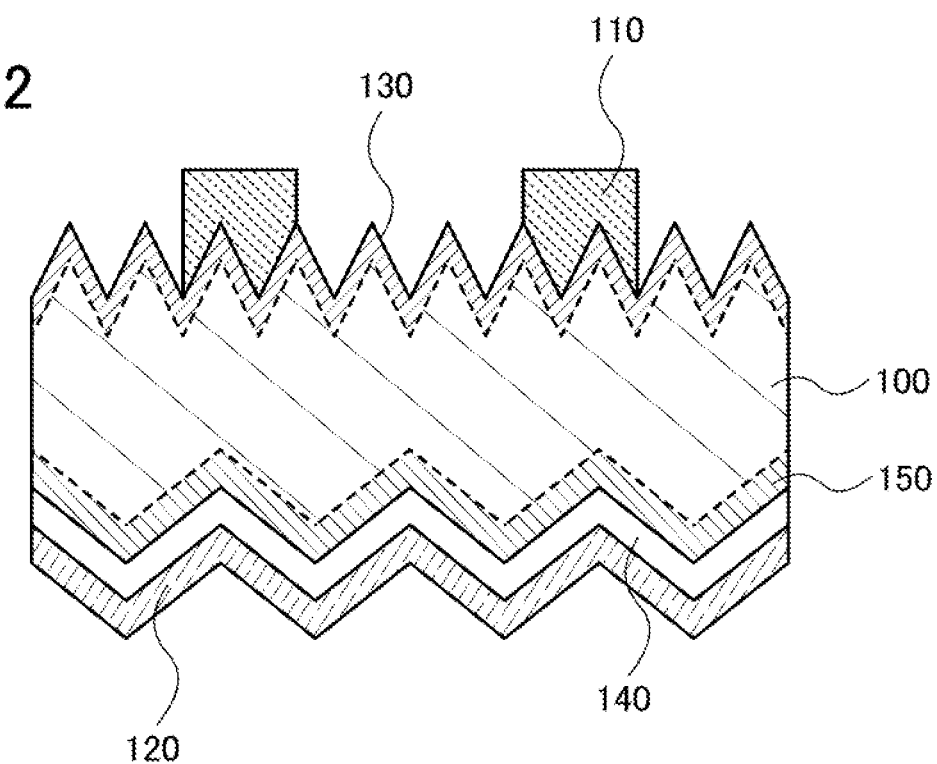
FIG. 2 is a cross-sectional view illustrating a photoelectric conversion device according to one embodiment of the present invention.

As illustrated in FIG. 2, in a surface layer of the crystalline silicon substrate 100 on the side in contact with the light-transmitting conductive film 140, a semiconductor layer 150 having the same conductivity as the crystalline silicon substrate 100 and having higher carrier density than the crystalline silicon substrate 100 may be provided as a back surface field (BSF) layer. In this embodiment, when a $p^+$ layer is provided as the BSF layer, a $p$-$p^+$ junction is formed, and minority carriers are repelled by the electric field of the $p$-$p^+$ junction and attracted to the p-n junction side, whereby recombination of carriers in the vicinity of the light-transmitting conductive film 140 can be prevented.

The light-transmitting conductive film 140 in one embodiment of the present invention is formed using a composite material of an inorganic compound and an organic compound. As the inorganic compound, a transition metal oxide can be used; in particular, an oxide of a metal belonging to any of Groups 4 to 8 of the periodic table is preferable. Specifically, vanadium oxide, niobium oxide, tantalum oxide, chromium oxide, molybdenum oxide, tungsten oxide, manganese oxide, rhenium oxide, or the like can be used. Among these, molybdenum oxide is especially preferable since it is stable in the air, has a low hygroscopic property, and is easily handled.

As the organic compound, any of a variety of compounds such as an aromatic amine compound, a carbazole derivative, an aromatic hydrocarbon, a high molecular compound (e.g., an oligomer, a dendrimer, or a polymer), and a heterocyclic compound having a dibenzofuran skeleton or a dibenzothiophene skeleton can be used. As the organic compound used for the composite material, an organic compound having an excellent hole-transport property is used. Specifically, a substance having a hole mobility of $10^{-6}$ cm$^2$/Vs or higher is preferably used. However, any other substance that has a property of transporting more holes than electrons may be used.

The transition metal oxide has an electron-accepting property; when it is used in combination with an organic compound having an excellent hole-transport property, a composite material thereof has high carrier density and exhibits conductivity. The composite material has high transmittance of light in a wide wavelength range from visible light region to infrared region.

The composite material is stable and silicon oxide is not generated at an interface with the crystalline silicon substrate; thus, defects at the interface can be reduced, resulting in improvement in lifetime of carriers.

In the case where the composite material is formed as a passivation film on an n-type single crystal silicon substrate, the following has been confirmed by the experiment: the lifetime of carriers is 700 μsec or more when 4-phenyl-4'-(9-phenylfluoren-9-yl)triphenylamine (abbreviation: BPAFLP) and molybdenum(VI) oxide are used as the organic compound and the inorganic compound respectively; the lifetime of carriers is 400 μsec or moire when 4,4'-bis[N-(1-naphthyl)-N-phenylamino]biphenyl (abbreviation: NPB) and molybdenum(VI) oxide are used as the organic compound and the inorganic compound respectively. Note that the lifetime of carriers in the case where a passivation film is not formed on an n-type single crystal silicon substrate is about 40 μsec, and the lifetime of carriers in the case where indium tin oxide (ITO) is formed on both of surfaces of the single crystal silicon substrate by a sputtering method is about 30 μsec.

For the first electrode 110 formed on the light-receiving surface side, a conductive resin such as a silver paste, a copper paste, a nickel paste, or a molybdenum paste can be used. For the second electrode 120 serving as the back electrode, a low-resistance metal such as aluminum, silver, or copper can be used. Alternatively, a conductive resin such as a silver paste or a copper paste may be used.

Figure 4:
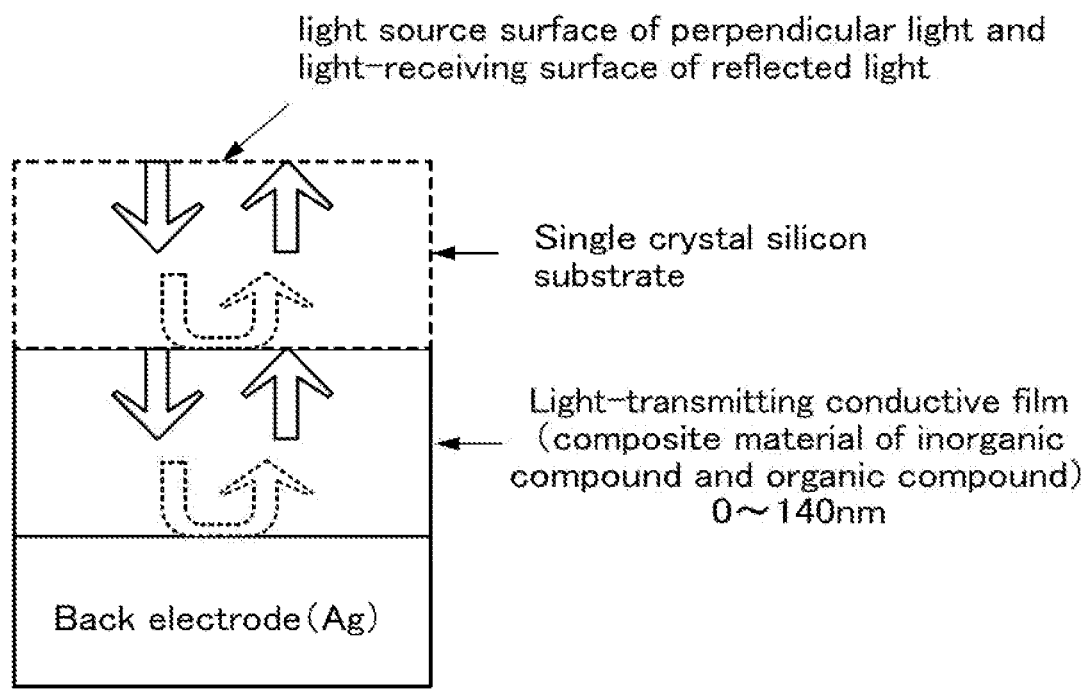
FIG. 4 shows a calculation model of reflectance.

Next, calculation results of reflectance in the vicinity of the back electrode will be described. FIG. 4 shows a calculation model, in which silver as the back electrode, the light-transmitting conductive film (the composite material of BPAFLP and molybdenum(VI) oxide), and the single crystal silicon substrate are stacked. Light is emitted perpendicularly to the back electrode, and the surface of the single crystal silicon substrate serves as a light source surface and as a light-receiving surface of reflected light.

At this time, it is assumed that the thickness of the single crystal silicon substrate is extremely small, and light absorption therein is not taken into consideration. Further, BPAFLP is used for the material of the light-transmitting conductive film as one example; however, even in the case where another organic material is used, the calculation results are not largely changed as long as the refractive index (n) and the extinction coefficient (k) are approximate to those of BPAFLP.

Optical simulation software, "DiffractMOD" (produced by RSoft Design Group, Inc.) was used for the calculation, and the reflectances of light having a wavelength of 700 nm to 1200 nm in the case where the thickness of the light-transmitting conductive film is changed from 0 nm to 140 nm in increments of 10 nm were calculated. Note that the reflectance of light having a wavelength shorter than 700 nm was not calculated because such light is largely absorbed by a single crystal silicon substrate and the amount of such light arriving at the back surface is negligible. Table 1 shows values of the refractive index (n) and the extinction coefficient (k) of each material, which were calculated at typical wavelengths. Note that the actual calculation was performed under the condition where the wavelength was changed in increments of 20 nm.

TABLE 1

| Wavelength | Single Crystal Silicon | | Light-transmiting Conductive Film (Composite Material of BPAFLP and Molybdenum Oxide) | | Back Electrode (Silver) | |
| --- | --- | --- | --- | --- | --- | --- |
| | n | k | n | k | n | k |
| 500 | 4.31E+00 | 7.26E−02 | 1.75E+00 | 5.00E−03 | 1.30E−01 | 2.91E+00 |
| 600 | 3.95E+00 | 2.69E−02 | 1.70E+00 | 1.80E−02 | 1.24E−01 | 3.72E+00 |
| 700 | 3.79E+00 | 1.27E−02 | 1.68E+00 | 3.00E−02 | 1.42E−01 | 4.51E+00 |
| 800 | 3.69E+00 | 6.48E−03 | 1.70E+00 | 5.90E−02 | 1.44E−01 | 5.28E+00 |
| 900 | 3.63E+00 | 2.62E−03 | 1.74E+00 | 5.10E−02 | 1.68E−01 | 6.02E+00 |
| 1000 | 3.58E+00 | 6.98E−04 | 1.71E+00 | 2.80E−02 | 2.13E−01 | 6.65E+00 |
| 1100 | 3.55E+00 | 1.41E−04 | 1.70E+00 | 2.10E−02 | 2.42E−01 | 7.16E+00 |
| 1200 | 3.52E+00 | 0.00E+00 | 1.70E+00 | 1.40E−02 | 3.02E−01 | 7.64E+00 |

Figure 5:
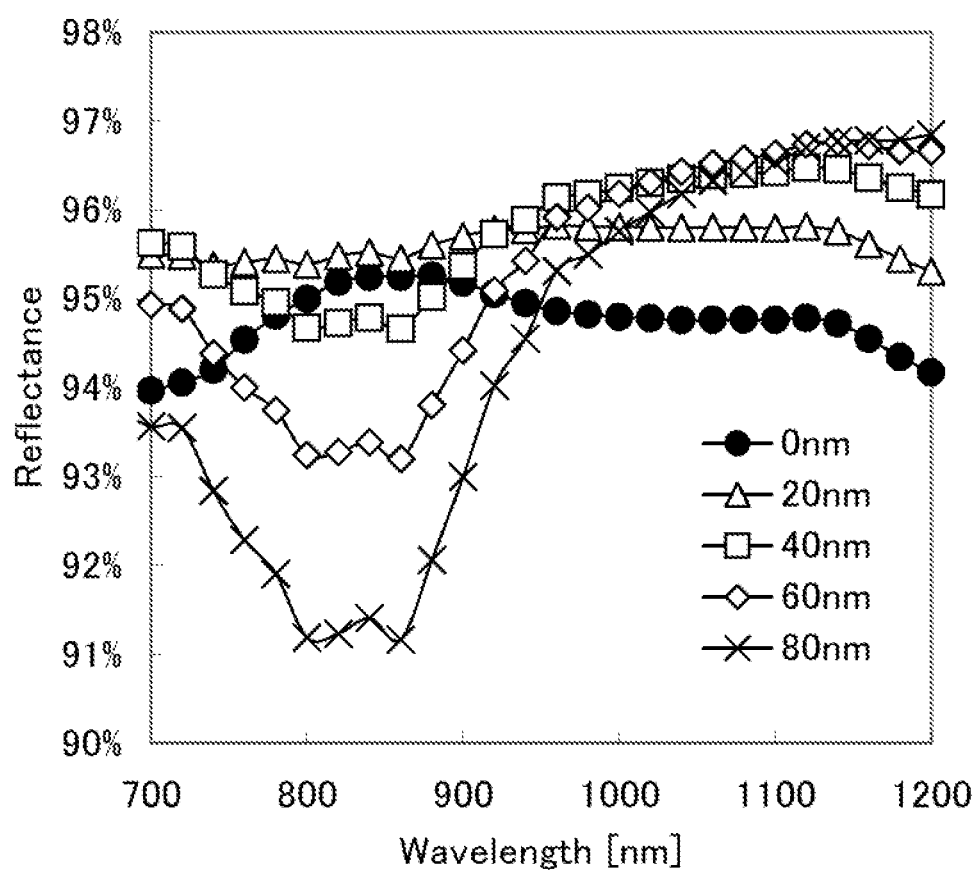
FIG. 5, shows calculation results of reflectance.
Figure 6:
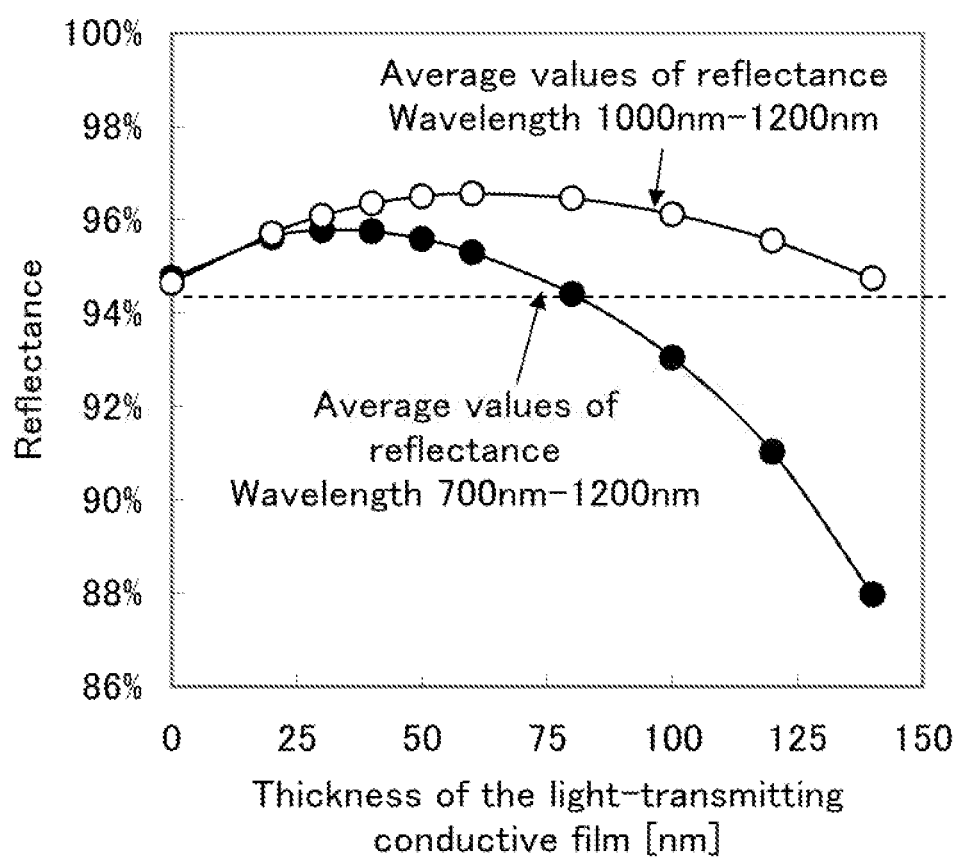
FIG. 6 shows calculation results of reflectance.

FIG. 5 shows calculation results of the reflectance in the vicinity of the back electrode under the above conditions. For the sake of clarity of the graph, only the calculation results obtained when the thickness of the light-transmitting conductive film is 0 nm, 20 nm, 40 nm, 60 nm, and 80 nm are shown. FIG. 6 shows the average values of reflectance in the vicinity of the back electrode with respect to the thicknesses, which are obtained from the calculation results. White circles in the graph represent average values of reflectance of light having a wavelength of 1000 nm to 1200 nm. Black circles in the graph represent average values of reflectance of light having a wavelength of 700 nm to 1200 nm. In the case where the thickness of the crystalline silicon substrate used in the photoelectric conversion device is small, light having a short wavelength also arrives at the back electrode; thus, average values of reflectance of light having a wavelength of 700 nm to 1200 nm may be particularly taken into consideration.

These results indicate that, for an improvement in reflectance on the back surface side, the thickness of the light-transmitting conductive film is greater than 0 nm and the upper limit thereof is about 140 nm; in particular, it is preferably greater than or equal to 20 nm and less than or equal to 80 nm, further preferably greater than or equal to 30 nm and less than or equal to 60 nm.

Next, a manufacturing method of the photoelectric conversion device illustrated in FIG. 1B will be described with reference to FIGS. 7A to 7C and FIGS. 8A to 8C.

A single crystal silicon substrate or a polycrystalline silicon substrate can be used for the crystalline silicon substrate 100 that can be used in one embodiment of the present invention. The manufacturing method of the crystalline silicon substrate is not particularly limited. In this embodiment, a p-type single crystal silicon substrate whose surface corresponds to the (100) plane and which is manufactured by a Magnetic Czochralski (MCZ) method is used (see FIG. 7A).

Next, the surface and the back surface of the crystalline silicon substrate 100 are subjected to a process for forming unevenness. First, with the use of an alkaline etchant (e.g., a 10% aqueous solution of potassium hydroxide), the surface and the back surface of the crystalline silicon substrate 100 are etched. In this embodiment, since the single crystal silicon substrate whose surface corresponds to the (100) plane is used, first unevenness 101 can be formed in the surface and the back surface of the crystalline silicon substrate 100 by utilizing a difference in etching rate between the (100) plane and the (111) plane (see FIG. 7B). In this step, one surface side where a light-receiving surface is to be formed may be covered with a resist mask, so that the first unevenness 101 may be formed only on the other surface side. Note that with a method using an alkali etchant, projecting portions each having: an aspect ratio greater than or equal to 0.5 and less than or equal to 3 can be formed with a distance of 2 μm to 10 μm.

Next, by a dry etching method, second unevenness 102 which is finer than the first unevenness 101 is formed on the surface side where a light-receiving surface is to be formed. For example, the crystalline; silicon may be etched with the use of a fluorocarbon-based gas and a chlorine-based gas in an RIE mode. Specifically, the projecting portions each having an aspect ratio greater than or equal to 3 and less than or equal to 15 can be formed with a distance of 60 nm to 500 nm. Note that in a dry etching method, etching uniformly proceeds regardless of plane orientation. Thus, in the case of using a polycrystalline silicon substrate as the crystalline silicon substrate 100, it is preferable that a dry etching method be employed-for forming unevenness in the surface and the back surface. Note that the above processing method for forming unevenness is just an example, and the processing method for forming unevenness is not limited to the above.

Figure 8A:
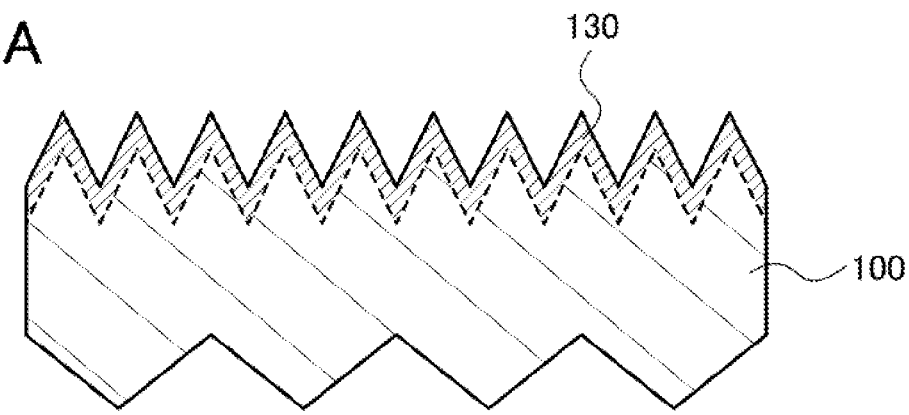
FIGS. 8A to 8C are cross-sectional views illustrating a process of a manufacturing method of a photoelectric conversion device according to one embodiment of the present invention

Next, the impurity region 130 whose conductivity type is opposite to that of the crystalline silicon substrate 100 is formed on the one surface side of the crystalline silicon substrate 100, where: a light-receiving surface is to be formed (see FIG. 8A). Here, the conductivity type of the crystalline silicon substrate 100 is p-type; thus, impurities imparting n-type conductivity are diffused into the surface layer of the crystalline silicon substrate 100, so that the impurity region 130 is formed. As impurities imparting n-type conductivity, phosphorus, arsenic, antimony, and the like can be given. For example, the crystalline silicon substrate is subjected to heat treatment at a temperature Higher than or equal to 800° C. and lower than or equal to 900° C. in an atmosphere of phosphorus oxychloride, whereby phosphorus can be diffused at a depth of approximately 0.5 μm from the surface of the crystalline silicon substrate.

Figure 8B:
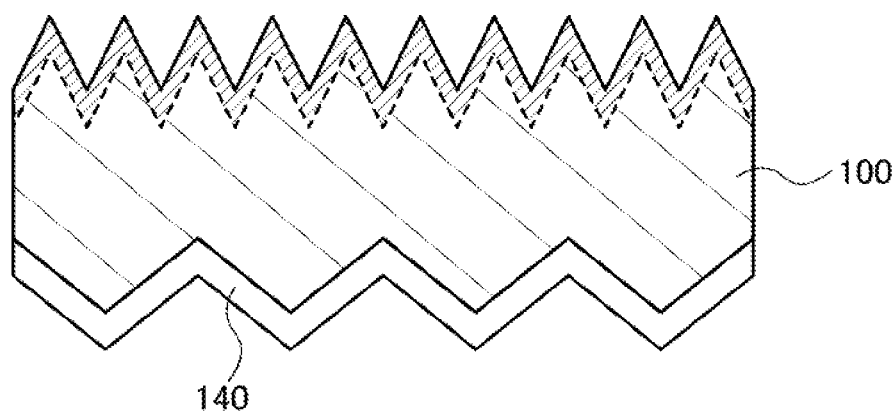

Next, the light-transmitting conductive film 140 is formed on the other surface side of the crystalline silicon substrate 100, which is to be a back surface side (see FIG. 8B). The light-transmitting conductive film 140 is formed by a co-evaporation method using the above-described inorganic compound and organic compound. A co-evaporation method is an evaporation method in which evaporation is concurrently carried out from a plurality of evaporation sources in one treatment chamber. It is preferable that deposition be performed in high vacuum. The high vacuum can be obtained by evacuation of a deposition chamber with an evacuation unit to a vacuum of about $5 \times 10^{-3}$ Pa or less, preferably about $10^{-4}$ Pa to $10^{-6}$ Pa.

In this embodiment, the light-transmitting conductive film 140 is formed by co-evaporating 4-phenyl-4'-(9-phenylfluoren-9-yl)triphenylamine (abbreviation: BPAFLP) and molybdenum(VI) oxide. The thickness of the light-transmitting conductive film 140 is 50 nm, and the weight ratio of BPAFLP to molybdenum oxide is controlled to be 2:1 (=BPAFLP:molybdenum oxide).

Note that in the case of providing a BSF layer ($p^+$ layer), dopant imparting p-type conductivity (such as boron or aluminum) may be dispersed on the other surface side of the crystalline silicon substrate 100, which is to be a back surface side, at high concentration before the light-transmitting conductive film 140 is formed.

Next, the second electrode 120 is formed on the other surface side of the crystalline silicon substrate 100, which is to be a back surface side. The second electrode 120 can be formed using a low-resistance metal such as aluminum, silver, or copper by a sputtering method, a vacuum evaporation method, or the like. Alternatively, the second electrode 120 may be formed using a conductive resin such as a silver paste or a copper paste by a screen printing method.

Figure 8C:
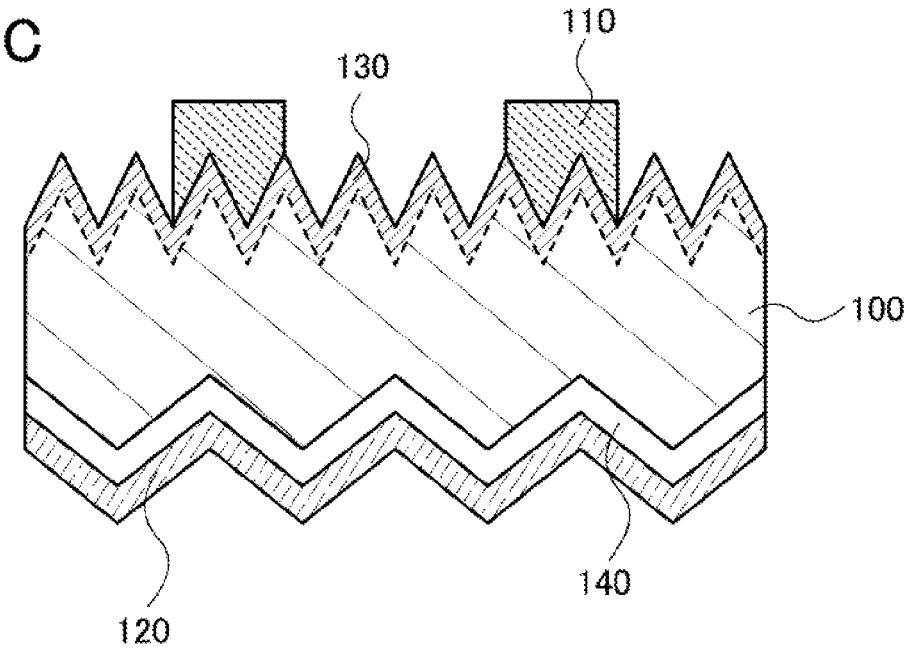

Next, the first electrode 110 is formed on the impurity region 130 (see FIG. 8C). The first electrode 110 is a grid electrode, which is preferably formed using a conductive resin such as a silver paste, a copper paste, a nickel paste, or a molybdenum paste by a screen printing method. Further, the first electrode 110 may be a stacked layer of different materials, such as a stacked layer of a silver paste and a copper paste.

In the above manner, a photoelectric conversion device which includes, as a reflection layer, a light-transmitting conductive film including an organic compound and an inorganic compound and which is one embodiment of the present invention can be manufactured.

This embodiment can be implemented in combination with any of the other embodiments as appropriate.

[Embodiment 2]

In this embodiment, a photoelectric conversion device which has a different structure from that of the photoelectric conversion device described in Embodiment 1, and a manufacturing method thereof will be described.

Figure 3A:
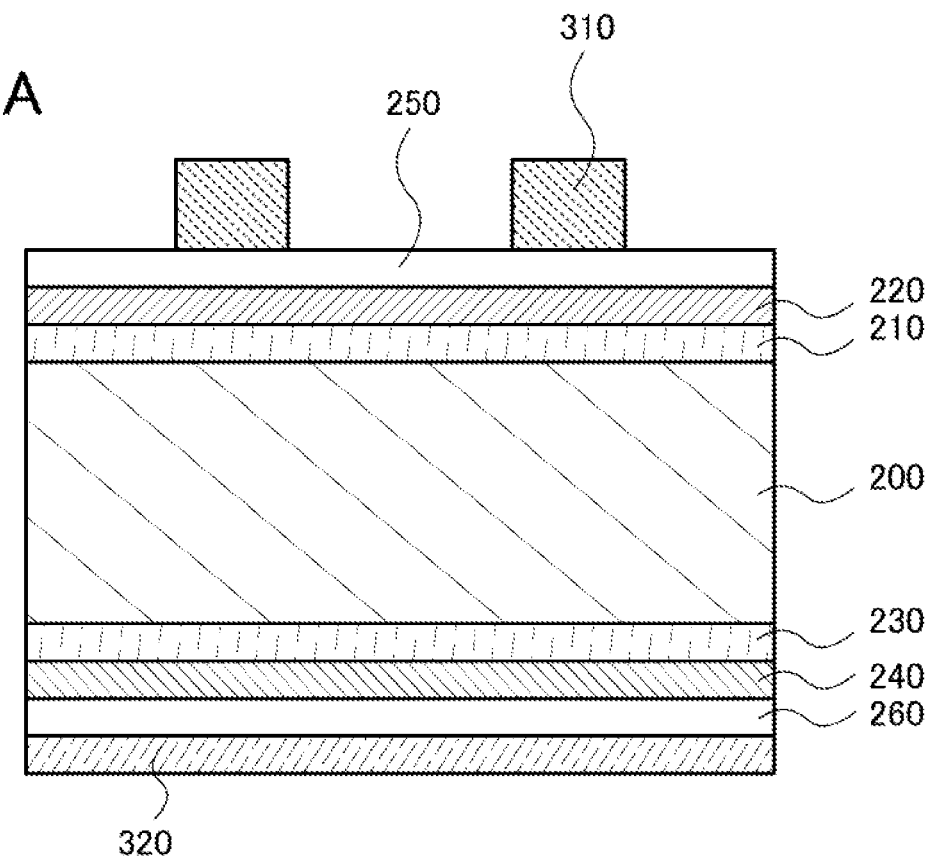
FIGS. 3A and 3B are cross-sectional views each: illustrating a photoelectric conversion device according to one embodiment of the present invention.
Figure 3B:
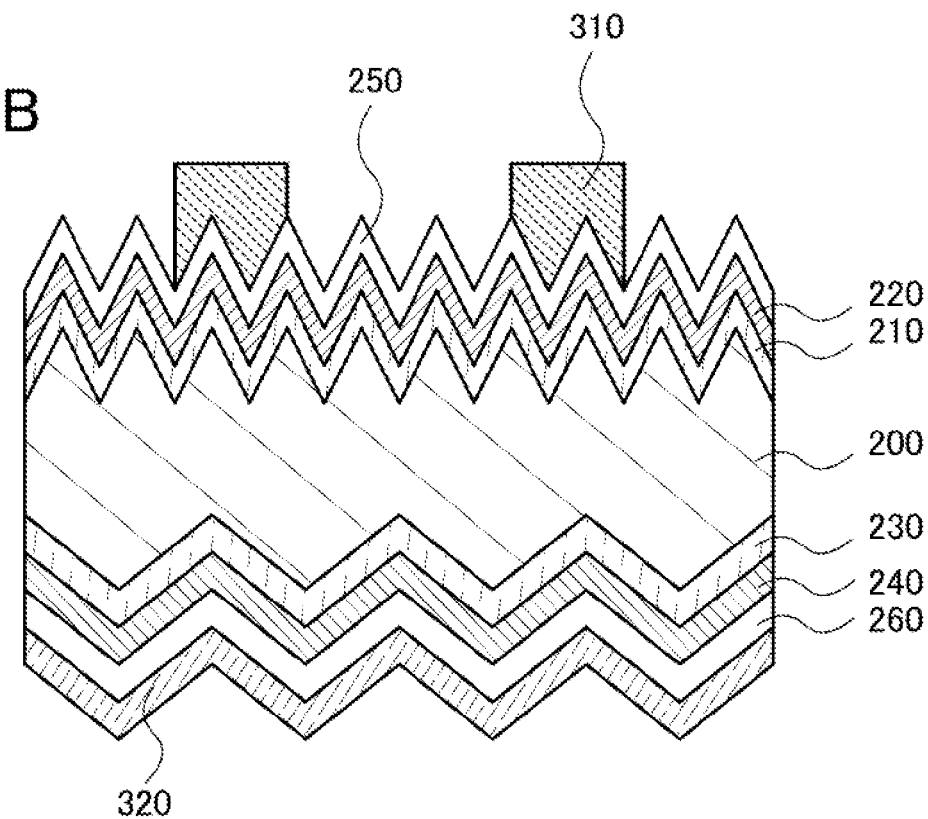

FIGS. 3A and 3B each illustrate a cross-sectional view of a photoelectric conversion device according to one embodiment of the present invention.

A photoelectric conversion device illustrated in FIG. 3A includes a first semiconductor layer 210 formed on one surface of a crystalline silicon substrate 200, a second semiconductor layer 220 formed on the first semiconductor layer, a first light-transmitting conductive film 250 formed on the second semiconductor layer, a first electrode 310 formed on the first light-transmitting conductive film, a third semiconductor layer 230 formed on the other surface of the crystalline silicon substrate 200, a fourth semiconductor layer 240 formed on the third semiconductor layer 230, a second light-transmitting conductive film 260 formed on the fourth semiconductor layer 240, and a second electrode 320 formed on the second light-transmitting conductive film 260. Note that a surface where the first electrode 310 is formed serves as a light-receiving surface.

FIG. 3B illustrates an example in which a surface (front surface) and a back surface (rear surface) of the crystalline silicon substrate 200 are processed to have unevenness in a stacked structure similar to that of FIG. 3A. The description in Embodiment 1 can be referred to for the details of the effect obtained by the process for forming unevenness.

Here, the first semiconductor layer 210 and the third semiconductor layer 230 include high-quality i-type amorphous silicon with few defects and can terminate defects on the surface of the crystalline silicon substrate 200. Note that in this specification, an "i-type semiconductor" refers not only to a so-called intrinsic semiconductor in which the Fermi level lies in the middle of the band gap, but also to a semiconductor in which both the concentration of an impurity imparting p-type Conductivity and that of an impurity imparting n-type conductivity are $\times 10^{20}$ cm$^{-3}$ or less, and in which the photoconductivity is 100 times or more as high as the dark conductivity. This i-type silicon semiconductor may include ah element belonging to Group 13 or Group 15 of the periodic table as an impurity.

The crystalline silicon substrate 200 has one conductivity type, and the second semiconductor layer 220 is a semiconductor layer having the opposite conductivity type to that of the crystalline silicon substrate 200. Thus, a p-n junction is formed between the crystalline silicon substrate 200 and the second semiconductor layer 220 with the first semiconductor layer 210 positioned therebetween. Here, in this embodiment, since a crystalline silicon substrate having n-type conductivity is used as the crystalline silicon substrate 200, the second semiconductor layer 220 has p-type conductivity.

The fourth semiconductor layer 240 provided On the back surface side has $n^+$-type conductivity, and thus an n-$n^+$ junction is formed in a state where the third semiconductor layer 230 is positioned between the fourth semiconductor layer 240 and the crystalline silicon substrate 200. That is, the third semiconductor layer 230 functions as a BSF layer.

The first light-transmitting conductive film 250 provided on the second semiconductor layer 220 can be formed using, for example, indium tin oxide, indium tin oxide containing silicon, indium oxide containing zinc, zinc oxide, zinc oxide containing gallium, zinc oxide containing aluminum, tin oxide, tin oxide containing fluorine, tin oxide containing antimony, or the like. The first light-transmitting conductive film 250 is not limited to a single layer, and may be a stacked layer of different films. For example, a stacked layer of indium tin oxide and; zinc oxide containing; aluminum, a stacked layer of indium tin oxide and tin oxide containing fluorine, or the like can be used. The total thickness is greater than or equal to 10 nm and less than or equal to 1000 nm.

For the first electrode 310 formed on the light-receiving surface side, a conductive resin such as a silver paste, a copper paste, a nickel paste, or a molybdenum paste can be used. For the second electrode 320 serving as the back electrode, a low-resistance metal such as aluminum, silver, or copper can be used. Alternatively, a conductive resin such as a silver paste or a copper paste may be used.

The second light-transmitting conductive film 260 provided between the fourth semiconductor layer 240 and the second electrode 320 is formed using a composite material of an inorganic compound arid an organic compound. For the inorganic compound and the organic compound, Embodiment 1 can be referred to.

In the photoelectric conversion device according to one embodiment of the present invention, by providing the second light-transmitting conductive film 260, an interface having: high birefringence is generated between the second light-transmitting conductive film 260 and the second electrode 320; thus, the reflectance can be improved. Therefore, a substantial optical path length in the crystalline silicon substrate can be lengthened. Since the light-transmitting conductive film has a high passivation effect, a defect is less likely to be generated at the interface with the fourth semiconductor layer 240 and recombination of photo-induced carriers can be prevented. By such effects, a, photoelectric conversion device with high conversion efficiency can be manufactured.

Next, a manufacturing method of the photoelectric conversion device illustrated in FIG. 3B will be described with reference to FIGS. 9A to 9C and FIGS. 10A to 10C.

A single crystal silicon substrate or a polycrystalline silicon substrate can be used for the crystalline silicon substrate 200 that can be used in one embodiment of the present invention. The manufacturing method of the crystalline silicon substrate is riot particularly limited. In this embodiment, an n-type single crystal silicon substrate whose surface corresponds to the (100) plane and which is manufactured by a Magnetic Czochralski (MCZ) method is used.

Figure 9A:
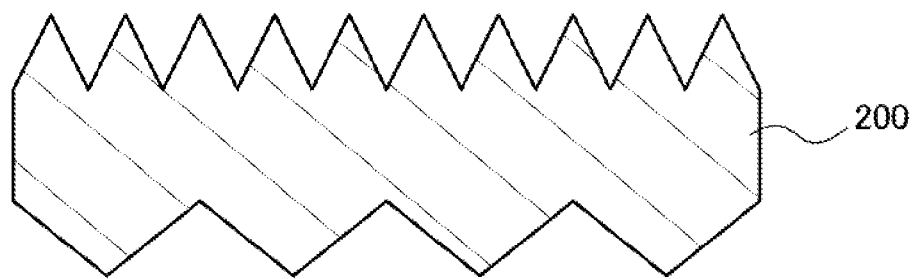
FIGS. 9A to 9C are cross-sectional views illustrating a process of a manufacturing method of a photoelectric conversion device; according to one embodiment of the present invention.

Next, the surface and the back surface of the crystalline silicon substrate 200 are subjected to a process for forming unevenness (see FIG. 9A). The description of FIGS. 7B and 7C in Embodiment 1 can be referred to for the details of the process for forming unevenness. Note that in the case of manufacturing the photoelectric conversion device having the structure of FIG. 3A, the process for forming unevenness may be skipped.

Next, the first semiconductor layer 210 is formed on one surface of the crystalline silicon substrate 200 by a plasma CVD method. The first semiconductor layer 210 preferably has a thickness greater than or equal to 3 nm and less than or equal to 50 nm. In this embodiment, the first semiconductor layer 210 is i-type and the, film thickness is 5 nm.

Film formation conditions of the first semiconductor layer 210 is as follows: monosilane is introduced to a reaction chamber at a flow rate greater than or equal to 5 sccm and less than or equal to 200 sccm; the pressure inside the reaction chamber is higher than or equal to 10 Pa and lower than or equal to 100 Pa; the electrode interval is greater than or equal to 15 mm and less than or equal to 40 mm; and the power density is greater than or equal to 8 mW/cm and less than or equal to 50 mW/cm$^2$.

Figure 9B:
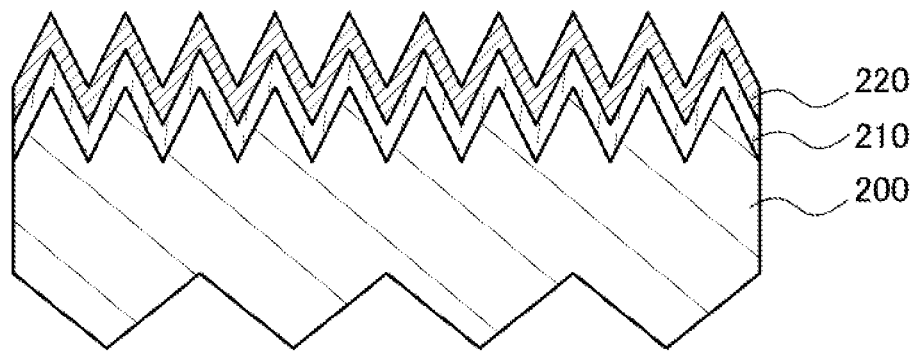

Next, the second semiconductor layer 220 is formed on the first semiconductor layer 210 (see FIG. 9B). The thickness of the second semiconductor layer 220 is preferably greater than or equal to 3 nm and less than or equal to 50 nm. In this embodiment, the second semiconductor layer 220 includes p-type microcrystalline silicon or p-type amorphous silicon, and has a thickness of 10 nm.

Film formation conditions of the second semiconductor layer 220 is as follows: monosilane with a flow rate greater than or equal to 1 sccm and less than or equal to 10 sccm, hydrogen with a flow rate greater than or equal to 100 sccm and less than or equal to 5000 sccm, and hydrogen-based diborane (0.1%) with a flow rate greater than or equal to 5 sccm and less than or equal to 50 sccm are introduced to a reaction chamber; the pressure inside the reaction chamber is higher than or equal to 450 Pa and lower than or equal to 100000 Pa, preferably higher than or equal to 2000 Pa and lower than or equal to 50000 Pa; the electrode interval is greater than or equal to 8 mm and less than or equal to 30 mm; and the power-density is greater than or equal to 200 mW/cm$^2$ and less than or equal to 1500 mW/cm$^2$.

Next, the third semiconductor layer 230 is formed on the other surface of the crystalline silicon substrate 200 by a plasma CVD method. The thickness of the third semiconductor layer 230 is preferably greater than or equal to 3 nm and less than or equal to 50 nm. In this embodiment, the third semiconductor layer 230 has i-type conductivity and has a thickness of 5 nm. Note that the third semiconductor layer 230 can be formed under the same film formation conditions as those of the first semiconductor layer 210.

Figure 9C:
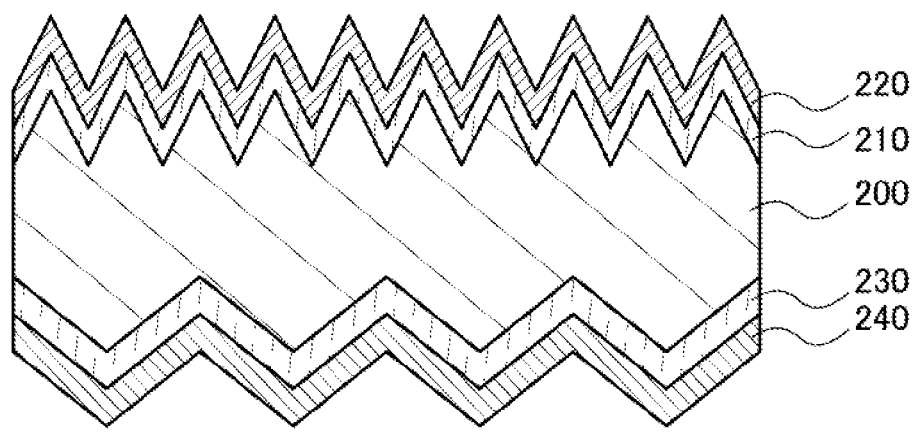

Next, the fourth semiconductor layer 240 is formed on the third semiconductor layer 230 (see FIG. 9C). The thickness of the fourth semiconductor layer 240 is preferably greater than or equal to 3 nm arid less than or equal to 50 nm. In this embodiment, the fourth semiconductor layer 240 includes n-type microcrystalline silicon or n-type amorphous silicon, and has a thickness of 10 nm.

Film formation conditions of the fourth semiconductor layer 240 is as follows: monosilane with a flow rate greater than or equal to 1 sccm and less than or equal to 10 sccm, hydrogen with a flow rate greater than or equal to 100 sccm and less than or equal to 5000 sccm, and hydrogen-based phosphine (0.5%) with a flow rate greater than or equal to 5 sccm and less than or equal to 50 sccm are introduced to a reaction chamber; the pressure inside the reaction chamber is higher than or equal to 450 Pa and lower than or equal to 100000 Pa, preferably higher than or equal to 2000 Pa and lower than or equal to 50000 Pa; the electrode interval is greater than or equal to 8 mm and less than or equal to 30 mm; and the power density is greater than or equal to 200 mW/cm$^2$ and less than or equal to 1500 mW/cm$^2$.

Note that in this embodiment, although an RF power source with a frequency of 13.56 MHz is used as a power source in forming the first semiconductor layer 210, the second semiconductor layer 220, the third semiconductor layer 230, and the fourth semiconductor layer 240, an RF power source with a frequency of 27.12 MHz, 60 MHz, or 100 MHz may be used instead. Furthermore, film formation may be performed by pulsed discharge as well as by continuous discharge. The pulsed discharge can improve the film quality and reduce particles produced in the gas phase.

Figure 10A:
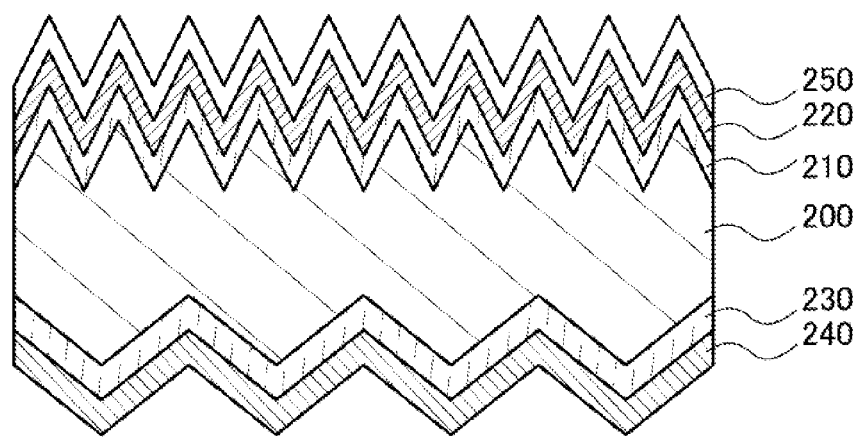
FIGS. 10A to 10C are cross-sectional views illustrating a process of a manufacturing: method of a photoelectric conversion device according to one embodiment of the present invention.

Then, the first light-transmitting conductive film 250 is formed on the second semiconductor layer 220 (see FIG. 10A). The first light-transmitting conductive film 250 can be formed using the above materials. The first light-transmitting conductive film 250 is not limited to a single layer, and may be a stacked layer of different films. The total thickness is greater than or equal to 10 nm and less than or equal to 1000 nm.

Figure 10B:
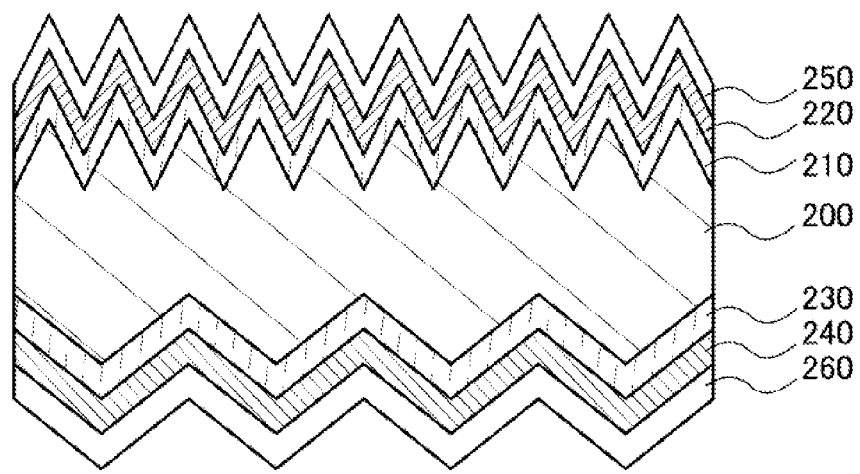

Then, the second light-transmitting conductive, film 260 is formed on the fourth semiconductor layer 240 (see FIG. 10B). The second light-transmitting conductive film 260 is formed by a co-evaporation method using the above-described inorganic compound and organic compound. A co-evaporation method is an evaporation method in which evaporation is concurrently carried out from a plurality/of evaporation sources in one treatment chamber. It is preferable that deposition be performed in high vacuum. The high vacuum can be obtained by evacuation of a deposition chamber with an evacuation unit to a vacuum of about $5\times10^{-3}$ Pa or less, preferably about $10^{-4}$ Pa to $10^{-6}$ Pa.

In this embodiment, the second light-transmitting conductive film 260 is formed by co-evaporating 4-phenyl-4'-(9-phenylfluoren-9-yl)triphenylamine (abbreviation: BPAFLP) and molybdenum(VI) oxide: The thickness of the second light-transmitting conductive film 260 is 50 nm, and the weight ratio of BPAFLP to molybdenum oxide is controlled to be 2:1 (=BPAFLP:molybdenum oxide).

Next, the first electrode 310 is formed on the first light-transmitting conductive film 250. The first electrode 310 is a grid electrode, which is preferably formed using a conductive resin such as a silver paste, a copper paste, a nickel paste, or a molybdenum paste by a screen printing method. Further, the first electrode 310 may be a stacked layer of different materials, such as a stacked layer of a silver paste and a copper paste.

Figure 10C:
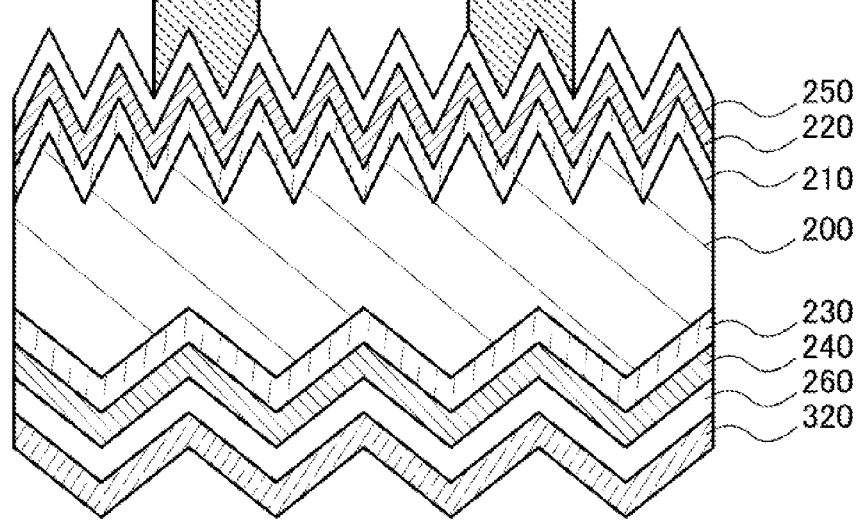

Next, the second electrode 320 is formed on the second light-transmitting semiconductor film 260 (see FIG. 10C). The second electrode 320 can be formed using a low-resistance metal such as silver, aluminum, or copper by a sputtering method, a vacuum evaporation method, or the like. Alternatively, the second electrode 320 may be formed using a conductive resin such as a silver paste or a copper paste by a screen printing method.

Note that the formation order of the films provided on the surface side and the back surface side of the crystalline silicon substrate 200 is not limited to the order described above as long as the structure illustrated in FIG. 10C can be obtained. For example, formation of the second semiconductor layer 220 may follow formation of the first semiconductor layer 210.

In the above manner, a photoelectric conversion device which includes, as a reflection layer, a light-transmitting conductive film including an organic compound and an inorganic compound and which is one embodiment of the present invention can be manufactured.

This embodiment can be implemented in combination with any of the other embodiments as appropriate.

[Embodiment 3]

In this embodiment, the light-transmitting conductive film described in Embodiments 1 and 2 will be described.

As the light-transmitting conductive film used as a reflection layer of the photoelectric conversion device described in Embodiments 1 and 2, a composite material of a transition metal oxide and an organic compound can be used. Note that in this specification, the word "composite" means not only a state in which two materials are simply mixed but also a state in which a plurality of materials is mixed arid charges are transferred between the materials.

As the transition metal oxide, a transition metal oxide having an electron-accepting property can be used. Specifically, among transition metal oxides, an oxide of a metal belonging to any of Groups 4 to 8 of the periodic table is preferable. In particular, vanadium oxide, niobium oxide, tantalum oxide, chromium oxide, molybdenum oxide, tungsten oxide, manganese oxide, and rhenium oxide are preferable because of their excellent electron-accepting property. Among these, molybdenum oxide is especially preferable since it is stable in the air, has a low hygroscopic property, and is easily handled.

As the organic compound, any of a variety of compounds such as an aromatic amine compound, a carbazole derivative, an aromatic hydrocarbon, a high molecular compound (e.g., an oligomer, a dendrimer, or a polymer), and a heterocyclic compound having a dibenzofuran skeleton or a dibenzothiophene skeleton can be used. As the organic compound used for the composite material, an organic compound having an excellent hole-transport property is used. Specifically, a substance having a hole mobility of $10^{-6}$ cm$^2$/Vs or higher is preferably used. However, any other substance that has a property of transporting more holes than electrons may be used.

In a composite material of the above-described transition metal oxide and the above-described organic compound, electrons in the highest occupied molecular orbital level (HOMO level) of the organic compound are transferred to the conduction band of the transition metal oxide, whereby interaction between the transition metal oxide and the organic compound occurs. Due to this interaction, the composite material including the transition metal oxide and the organic compound has high carrier density and has conductivity.

Organic compounds that can be used for the composite material are specifically given below.

As the aromatic amine compound that can be used for the composite material, the following can be given as examples: 4,4'-bis[N-(1-naphthyl)-N-phenylamino]biphenyl (abbreviation: NPB); N,N'-bis(3-methylphenyl)-N,N'-diphenyl-[1,1'-biphenyl]-4,4'-diamine (abbreviation: TPD); 4,4',4"-tris(N,N-diphenylamino)triphenylamine (abbreviation: TDATA); 4,4',4"-tris[N-(3-methylphenyl)-N-phenylamino]triphenylamine (abbreviation: MTDATA); and N,N'-bis(spiro-9,9'-bifluoren-2-yl)-N,N'-diphenylbenzidine (abbreviation: BSPB). In addition, the following can be given: N,N'-bis(4-methylphenyl)-N,N'-diphenyl-p-phenylenediamine (abbreviation: DTDPPA); 4,4'-bis[N-(4-diphehylaminophenyl)-N-phenylamino]biphenyl (abbreviation: DPAB); N,N'-bis[4-[bis(3-methylphenyl)amino]phenyl]-N,N'-diphenyl-[1,1'-biphenyl]-4,4'-diamine (abbreviation: DNTPD); 1,3,5-tris[N-(4-diphenylaminophenyl)-N-phenylamino]benzene (abbreviation: DPA3B); 4-phenyl-4'-(9-phenylfluoren-9-yl)triphenylamine (abbreviation: BPAFLP); and 4,4'-bis[N-(9,9-dimethylfluoren-2-yl)-N-phenylamino]biphenyl (abbreviation: DFLDPBi).

As the carbazole derivative that can be used for the composite material, the following can be specifically given: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); and 3-[N-(1-naphthyl)-N-(9-phenylcarbazol-3-yl)amino]-9-phenylcarbazole (abbreviation: PCzPCN1).

As other examples of the carbazole derivative that can be used for the composite material, the following can be given: 4,4'-di(N-carbazolyl)biphenyl (abbreviation: CBP); 1,3,5-tris[4-(N-carbazolyl)phenyl]benzene (abbreviation: TCPB); 9-[4-(N-carbazolyl)phenyl]-10-phenylanthracene (abbreviation: CzPA); and 1,4-bis[4-(N-carbazolyl)phenyl]-2,3,5,6-tetraphenylbenzene.

As the aromatic hydrocarbon that can be used for the composite material, the following can be given, for example: 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 9,10-bis[2-(1-naphthyl)phenyl]-2-tert-butylanthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; and 2,5,8,11-tetra(tert-butyl)perylene. Besides, pentacene, coronene, or the like can also be used. In particular, the aromatic hydrocarbon which has a hole mobility of $1\times10^{-6}$ cm$^2$/Vs or higher and has 14 to 42 carbon atoms is preferable.

The aromatic hydrocarbon used for the composite material may have; a vinyl skeleton. As the aromatic;hydrocarbon having a vinyl group, the following can be given, for example: 4,4'-bis(2,2-diphenylvinyl)biphenyl (abbreviation: DPVBi); arid 9,10-bis[4-(2,2-diphenylvinyl)phenyl]anthracene (abbreviation: DPVPA).

The organic compound;used for the composite material may be a heterocyclic compound having a dibenzofuran skeleton or a dibenzothiophene skeleton.

The organic compound that can be used for the composite material may be a high molecular compound, and the following can be given as examples: poly(N-vinylcarbazole) (abbreviation: PVK); poly(4-vinyltriphenylamine) (abbreviation: PVTPA); poly[N-(4-{N'-[4-(4-diphenylamino)phenyl]phenyl-N'-phenylamino}phenyl)methacrylamide] (abbreviation: PTPDMA); and poly[N,N'-bis(4-butylphenyl)-N,N'-bis(phenyl)benzidine] (abbreviation: Poly-TPD).

Figure 11:
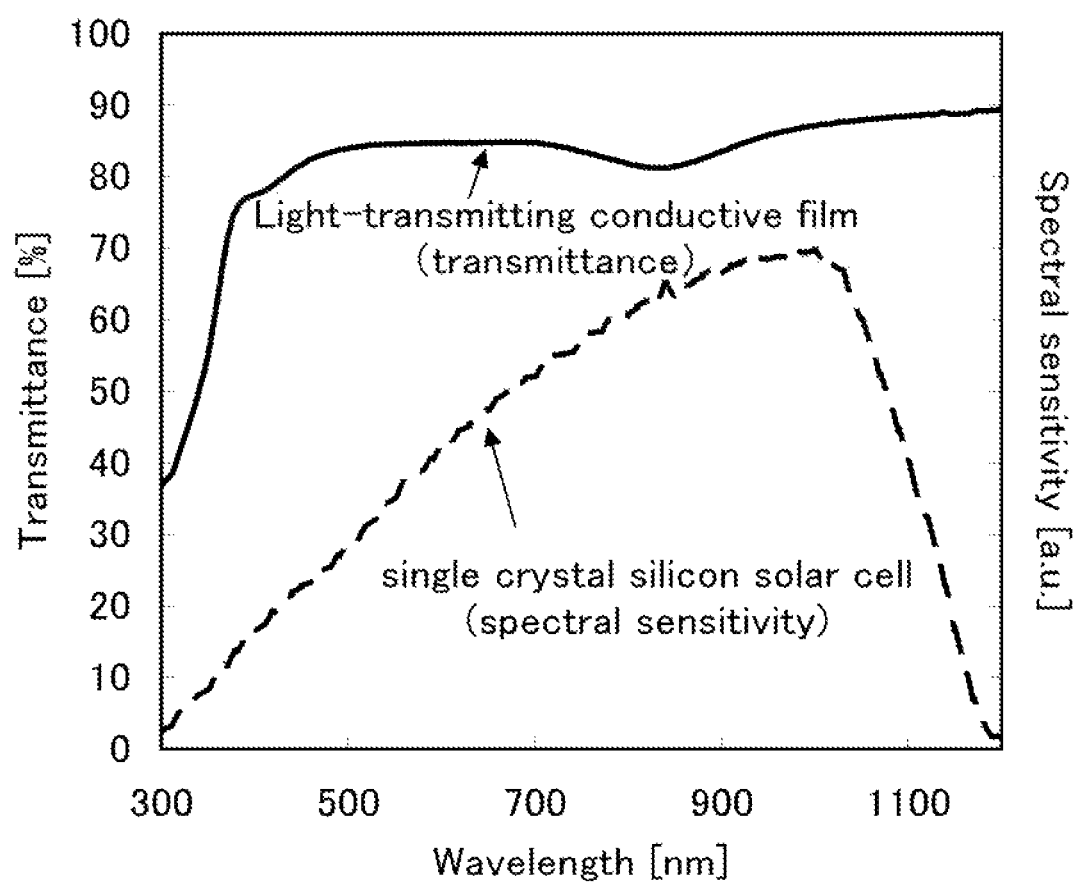
FIG. 11 shows spectral transmittance of a light-transmitting conductive film and spectral sensitivity characteristics of a single crystal silicon photoelectric conversion device.

FIG. 11 shows the spectral transmittance of a light-transmitting conductive film (with a thickness of 57 nm) obtained by co-evaporation of 4-phenyl-4'-(9-phenylfluoren-9-yl)triphenylamine (abbreviation: BPAFLP) and molybdenum(VI) oxide and the spectral sensitivity characteristics of a general single crystal silicon solar cell. As shown in FIG. 11, the light-transmitting conductive film described in this embodiment has an excellent light-transmitting property with respect to light having a wavelength range where crystalline silicon absorbs light; therefore, light reflected by a back electrode and then returned to the crystalline silicon is efficiently utilized for photoelectric conversion.

Any of a variety of methods can be employed for forming the light-transmitting conductive film, regardless of whether it is a dry process or a wet process. For a dry process, for example, a co-evaporation method in which a plurality of evaporation materials is vaporized from a plurality of evaporation sources to form a film can be used. In an example of a wet process, a composition including a composite material is adjusted by a sol-gel method, and an inkjet method, a spin coating method, or the like is used to form a film.

The use of the above-described light-transmitting conductive film for a reflection layer of a photoelectric conversion device can improve the reflectance on a back electrode side and the electric characteristics of the photoelectric conversion device.

This embodiment can be implemented in combination with any of the other embodiments as appropriate.

This application is based on Japanese Patent Application serial no. 2011-034575 filed with Japan Patent Office on Feb. 21, 2011, the entire contents Of which are hereby incorporated by reference.

What is claimed is:

1. A photoelectric conversion device comprising:
a crystalline silicon substrate including a first surface and a second surface opposite to the first surface, wherein an impurity region is included in a first surface side of the crystalline silicon substrate;
a first electrode over the impurity region;
a light-transmitting conductive film in contact with the second surface of the crystalline silicon substrate; and
a second electrode in contact with the light-transmitting conductive film,
wherein the light-transmitting conductive film comprises an organic compound and an inorganic compound,
wherein the organic compound is 4-phenyl-4'-(9-phenylfluoren-9-yl)triphenylamine (abbreviation: BPAFLP),
wherein the inorganic compound is an oxide of a metal belonging to any of Groups 4 to 8 of the periodic table, and
wherein the light-transmitting conductive film is a reflection film.

2. The photoelectric conversion device according to claim 1,
wherein the inorganic compound is selected from the group consisting of vanadium oxide, niobium oxide, tantalum oxide, chromium oxide, molybdenum oxide, tungsten oxide, manganese oxide, and rhenium oxide.

3. The photoelectric conversion device according to claim 1,
wherein a thickness of the light-transmitting conductive film is greater than or equal to 30 nm and less than or equal to 60 nm.

4. The photoelectric conversion device according to claim 1, wherein the first electrode is on a light-receiving side of the photoelectric conversion device.

5. The photoelectric conversion device according to claim 1,
wherein the first surface of the crystalline silicon substrate includes a first unevenness,
wherein the second surface of the crystalline silicon substrate includes a second unevenness, and
wherein the first unevenness is finer than the second unevenness.

6. A photoelectric conversion device comprising:
a crystalline silicon substrate including a first surface and a second surface opposite to the first surface;
a first semiconductor layer over the first surface of the crystalline silicon substrate;
a second semiconductor layer over the first semiconductor layer;
a first light-transmitting conductive film over the second semiconductor layer;
a first electrode over the first light-transmitting conductive film;
a third semiconductor layer in contact with the second surface of the crystalline silicon substrate;
a fourth semiconductor layer in contact with the third semiconductor layer;
a second light-transmitting conductive film in contact with the fourth semiconductor layer; and
a second electrode in contact with the second light-transmitting conductive film,
wherein the second light-transmitting conductive film comprises an organic compound and an inorganic compound,
wherein the organic compound is 4-phenyl-4'-(9-phenylfluoren-9-yl)triphenylamine (abbreviation: BPAFLP),
wherein the inorganic compound is an oxide of a metal belonging to any of Groups 4 to 8 of the periodic table, and
wherein the second light-transmitting conductive film is a reflection film.

7. The photoelectric conversion device according to claim 6,
wherein the first semiconductor layer and the third semiconductor layer comprise i-type amorphous silicon.

8. The photoelectric conversion device according to claim 6,
wherein the second semiconductor layer comprises a silicon semiconductor having a conductivity type opposite to a conductivity type of the crystalline silicon substrate, and
wherein the fourth semiconductor layer comprises a silicon semiconductor having the same conductivity as the crystalline silicon substrate.

9. The photoelectric conversion device according to claim 6,
wherein the inorganic compound is selected from the group consisting of vanadium oxide, niobium oxide, tantalum oxide, chromium oxide, molybdenum oxide, tungsten oxide, manganese oxide, and rhenium oxide.

10. The photoelectric conversion device according to claim 6, wherein a thickness of the second light-transmitting conductive film is greater than or equal to 30 nm and less than or equal to 60 nm.

11. The photoelectric conversion device according to claim 6, wherein the first electrode is on a light-receiving side of the photoelectric conversion device.

12. The photoelectric conversion device according to claim 6,
wherein the first surface of the crystalline silicon substrate includes a first unevenness,
wherein the second surface of the crystalline silicon substrate includes a second unevenness, and
wherein the first unevenness is finer than the second unevenness.

* * * * *